(12) United States Patent
Byczek

(10) Patent No.: US 6,420,652 B1
(45) Date of Patent: Jul. 16, 2002

(54) PLASTIC BUSHING

(75) Inventor: Roger Byczek, Lake in the Hills, IL (US)

(73) Assignee: Cinch Connectors, Inc., Lombard, IL (US)

(*) Notice: Subject to any disclaimer, the term of this patent is extended or adjusted under 35 U.S.C. 154(b) by 0 days.

(21) Appl. No.: 09/576,395

(22) Filed: May 22, 2000

(51) Int. Cl.[7] .................................................. H01H 9/02

(52) U.S. Cl. ............................. 174/58; 174/50; 174/59; 174/152 R; 220/3.2; 220/3.3

(58) Field of Search ........................ 174/653, 151, 174/152 G, 153 G, 135, 59, 60, 53, 48, 57, 51, 54, 52.2, 58, 152 B, 142; 220/3.2, 3.3, 3.94, 241, 3.5–3.8; 248/56, 200.1; 439/131, 501

(56) References Cited

U.S. PATENT DOCUMENTS

| | | | |
|---|---|---|---|
| 271,035 A | 1/1883 | Carpenter | |
| 737,407 A | 8/1903 | Hirsch | |
| 2,225,472 A | 12/1940 | Franklin | 173/322 |
| 2,406,852 A | 9/1946 | Relf | 174/153 |
| 2,967,593 A | 1/1961 | Cushman | 189/34 |
| 3,161,906 A | 12/1964 | Yarm | 16/2 |
| 3,204,284 A | 9/1965 | Merriman | 16/2 |
| 3,645,324 A | 2/1972 | Hicks | 164/388 |
| 3,768,115 A | 10/1973 | Hoffmann et al. | 16/2 |
| 3,829,184 A | 8/1974 | Chevret | 308/237 |
| 3,855,413 A | 12/1974 | Baillie | 174/48 |
| 3,895,409 A | 7/1975 | Kwatonowski | 16/2 |
| 4,134,175 A | 1/1979 | Contoyanis | 16/2 |
| 4,232,496 A | 11/1980 | Warkentin | 52/403 |
| 4,289,924 A * | 9/1981 | Pearce, Jr. et al. | |
| 4,545,837 A | 10/1985 | Wehnert et al. | 156/191 |
| 4,684,092 A * | 8/1987 | Reiker | 248/200.1 |
| 4,685,172 A | 8/1987 | O'Connor | 16/2 |
| 4,909,405 A * | 3/1990 | Kerr, Jr. | 220/3.9 |
| 4,938,314 A | 7/1990 | Sitzler et al. | 184/1.5 |
| 4,975,008 A * | 12/1990 | Wagner | 411/337 |
| 5,294,225 A | 3/1994 | Kazino et al. | 411/182 |
| 5,391,837 A * | 2/1995 | Carey | 174/50 |
| 5,586,388 A * | 12/1996 | Hirao et al. | |
| 5,586,742 A * | 12/1996 | Carter | 174/51 |
| 5,625,536 A * | 4/1997 | Soyano et al. | |
| 5,673,927 A | 10/1997 | Vermillion | 280/611 |
| 5,736,675 A * | 4/1998 | Michaels | 174/50.5 |
| 5,750,924 A * | 5/1998 | Sonntag et al. | 174/50 |

(List continued on next page.)

FOREIGN PATENT DOCUMENTS

| | | |
|---|---|---|
| DE | 19734128 C | 9/1998 |
| DE | 19742470 A | 4/1999 |
| DE | 19801006 A | 7/1999 |
| FR | 2707002 A | 12/1994 |
| JP | 54038368 A | 3/1979 |

OTHER PUBLICATIONS

2 Photographs and 2 photocopies of an enclosure with a plastic housing and metal bushings, Cinch Connectors, Inc., Lombard, Illinois, sold prior to May 22, 1999.

*Primary Examiner*—Dean A. Reichard
*Assistant Examiner*—Angel R. Estrada
(74) *Attorney, Agent, or Firm*—Leydig, Voit & Mayer, Ltd.

(57) ABSTRACT

An enclosure including a housing and a plurality of plastic bushings is disclosed. The plastic bushing includes a pair of ends, both with an aperture, a bore running between the apertures, and a flange with a poly-sided perimeter. The flange engages the housing such that the bushing is translationally and rotationally fixed relative to the housing. The plastic bushing may include a plurality of glass fibers aligned with a longitudinal axis of the bore. The plastic bushing may be electrolytic dissolution resistant and corrosion resistant. The plastic bushing may have a thermal coefficient matching that of the plastic housing.

42 Claims, 13 Drawing Sheets

U.S. PATENT DOCUMENTS

| | | | |
|---|---|---|---|
| 5,801,330 A | * 9/1998 | Gademann et al. | 174/52.1 |
| 5,843,361 A | * 12/1998 | Gellert | 264/297.2 |
| 5,860,548 A | * 1/1999 | Kerr, Jr. | 220/3.2 |
| 5,879,115 A | 3/1999 | Medal | 411/82 |
| 6,043,983 A | * 3/2000 | Taylor et al. | |
| 6,096,974 A | * 8/2000 | Reiker | 174/62 |
| 6,147,305 A | * 11/2000 | Honma et al. | 174/52.1 |
| 6,188,019 B1 | * 2/2001 | Baur et al. | 174/51 |
| 6,204,450 B1 | * 3/2001 | Reiker | 174/58 |

* cited by examiner

PLASTIC BUSHING

FIELD OF THE INVENTION

The present invention relates generally to a bushing and, more particularly, to a plastic bushing that can be used with a housing. The invention is particularly well suited for use in an engine compartment of a vehicle.

BACKGROUND OF THE INVENTION

Electrical enclosures are used to hold electrical components, such as printed circuit boards and integrated circuits. For example, electrical enclosures hold the control modules for automobiles, such as the engine control module or the anti-lock braking module. The modules electronically perform many diagnostic and control functions.

As computer requirements have grown, manufacturers have begun to locate the modules closer to the equipment under evaluation. For example, modules are mounted in the engine compartment. Ideally, the enclosure effectively and inexpensively protects the control module from mechanical harm and the various environmental conditions accompanying a vehicular application.

One category of prior art enclosure uses an all-metal construction. The all-metal enclosure is typically made from die-casted aluminum or zinc and is assembled with an additional metal cover and screws. The enclosure shields the module from mechanical harm but is susceptible to the effects of humidity and liquid infiltration after repeated thermal cycling. To protect the module from the ambient environment, the all-metal enclosure is typically located within the passenger compartment.

The all-metal enclosure must be adapted to operate reliably outside of the passenger compartment. The adaptations include: over-coating the metal surface of the enclosure to reduce corrosion from the outside environment; implementing rattle-resistant fastening techniques to withstand the higher vibration found outside the passenger compartment; adding vibration and shock protection for the electrical components within the enclosure; and replacing the existing fasteners with other fasteners designed to reduce electrolytic contamination. The above corrections add cost to the module and only reduce the number of failures rather than eliminate them.

Another category of prior art enclosure includes a plastic housing. The prior art plastic housing possesses its own set of problems. For example, the plastic housing can crack or split if the bolts used to mount the enclosure are over-tightened. The prior art enclosure uses metal bushings with the plastic housing. The metal bushings are either pressed into the housing as a secondary operation or over molded during the production of the plastic housing.

However, the existing problems with the prior art all-metal enclosure also apply to the metal bushings. For instance, metal bushings must be plated with a corrosion resistant material to protect the bushings from environmental conditions. Further, the thermal coefficients of the plastic housing and the metal bushings are different. Thus, the ambient temperature causes the bushings and the housing to expand or contract at different rates, thereby creating gaps between the bushings and the housing. The overall improvements achieved by plastic housings are accordingly reduced by the use of metal bushings.

SUMMARY OF THE INVENTION

According to the teachings of the present invention, an enclosure can include a housing and a plurality of plastic bushings. The housing can be made from plastic and can be used to hold electrical components.

The inventive plastic bushing can be made from a temperature-resistant plastic and include a pair of ends, both with a countersink and an aperture, a bore passing between the apertures and parallel to the longitudinal axis of the bushing, and a flange with a poly-sided perimeter. The flange of the bushing engages the housing such that the bushing is fixed translationally and rotationally relative to the housing.

The bore can accept a fastener, such as a bolt, to retain the enclosure. The plastic bushing may be electrolytic-dissolution resistant and corrosion resistant. To resist creep, the plastic bushing may use a plastic that includes a plurality of fibers as a filler material. The fibers provide strength in the direction of stress and can be oriented parallel to the longitudinal axis of the bore of the bushing.

The present invention will become more readily apparent upon reading the following detailed description of exemplified embodiments and upon reference to the accompanying drawings herein.

DESCRIPTION OF THE EMBODIMENTS

Figure 1:
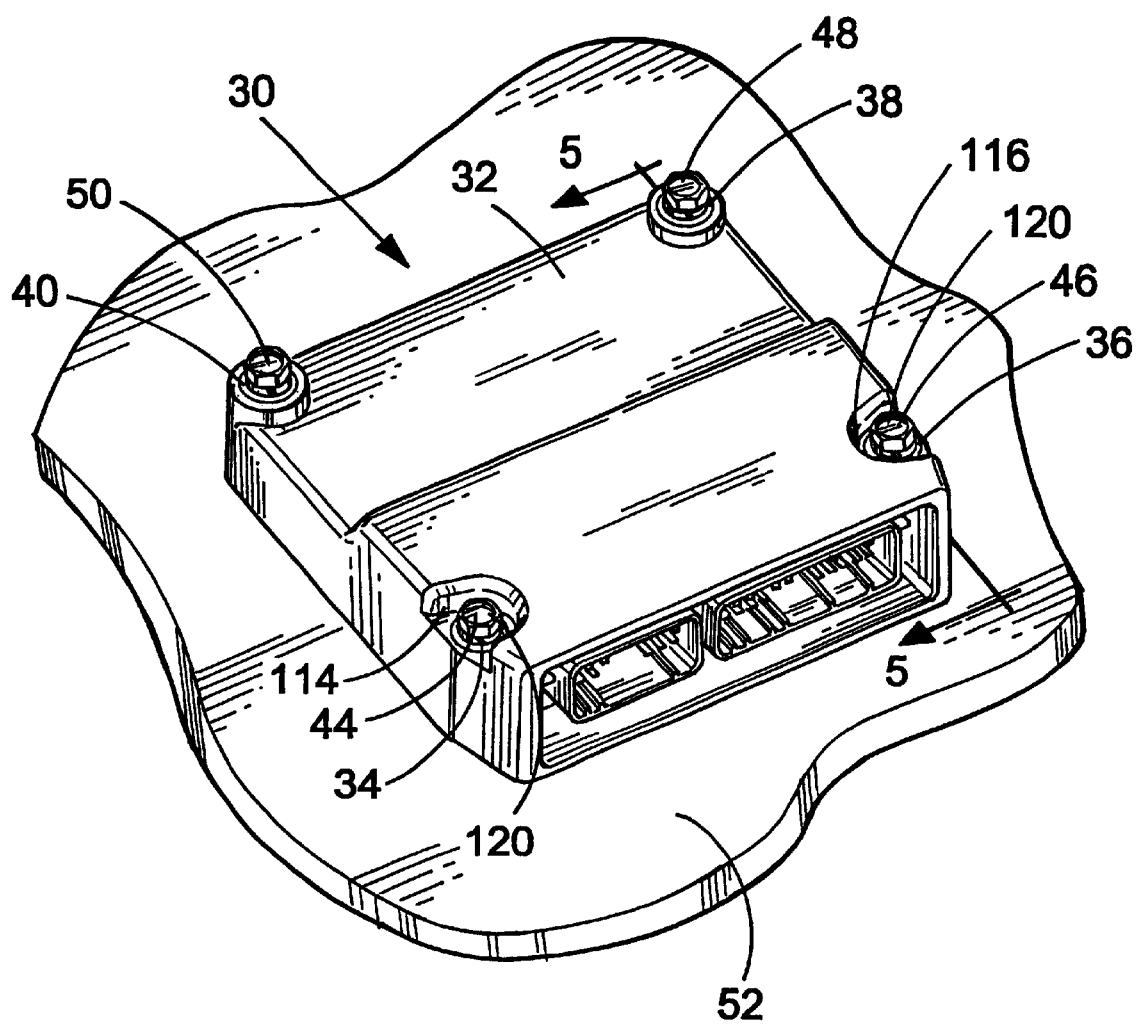
FIG. 1 is a perspective view of an enclosure constructed in accordance with the teachings of the invention shown attached to a frame by bolts.
Figure 5:
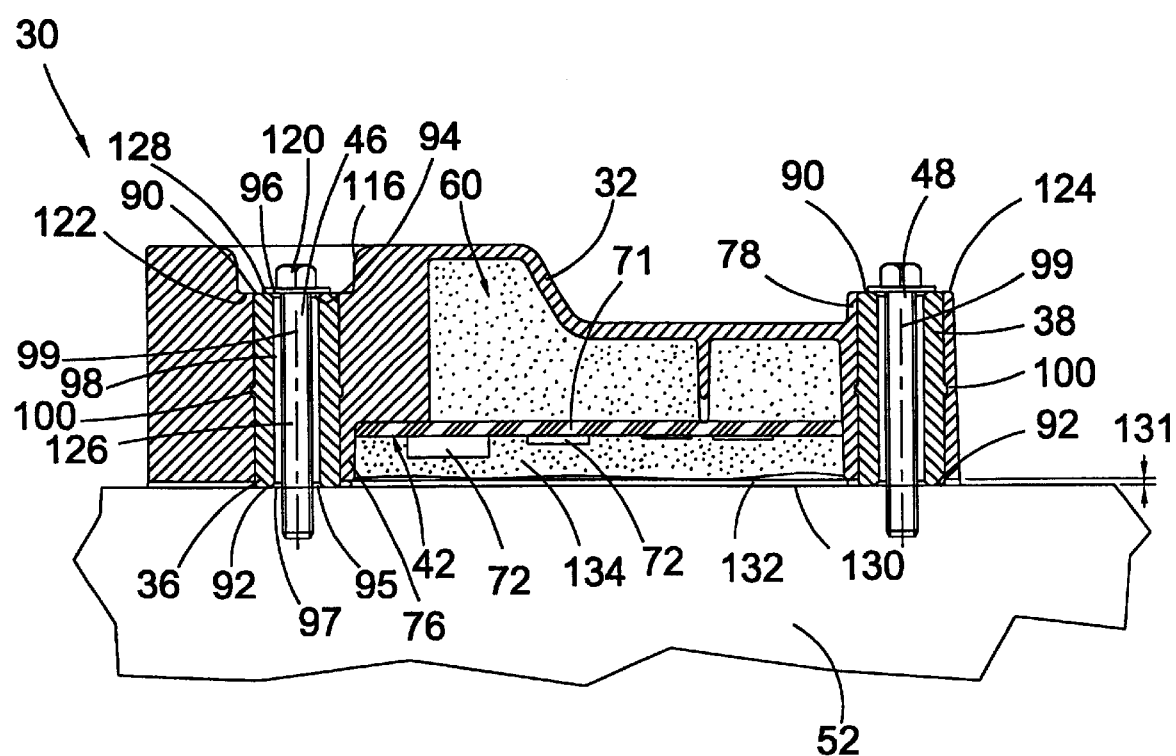
FIG. 5 is a cross-sectional view taken along line 5—5 in FIG. 1 that shows the frame, the bolts, the electrical component, and epoxy.

An enclosure 30 constructed in accordance with the teachings of the present invention is illustrated in FIG. 1. As shown in FIG. 1, the enclosure 30 can include a plastic housing 32 and four plastic bushings 34, 36, 38, 40. The bushings 34, 36, 38, 40 are embedded in the housing 32. An electrical component 42, as shown in FIG. 5, can be attached to the enclosure 30 and held within the housing 32. Threaded bolts 44, 46, 48, 50 can attach the enclosure 30 to a frame 52.

To provide a surface to which the enclosure 30 can be attached, the frame 52 is provided. The frame 52 can be any suitable surface for mounting the enclosure 30. The frame 52 can be a part of a vehicle, such as the chassis, and is typically a portion of rectangular tubing or channel. The frame 52 can be made from metal or plastic, for example.

Figure 2:
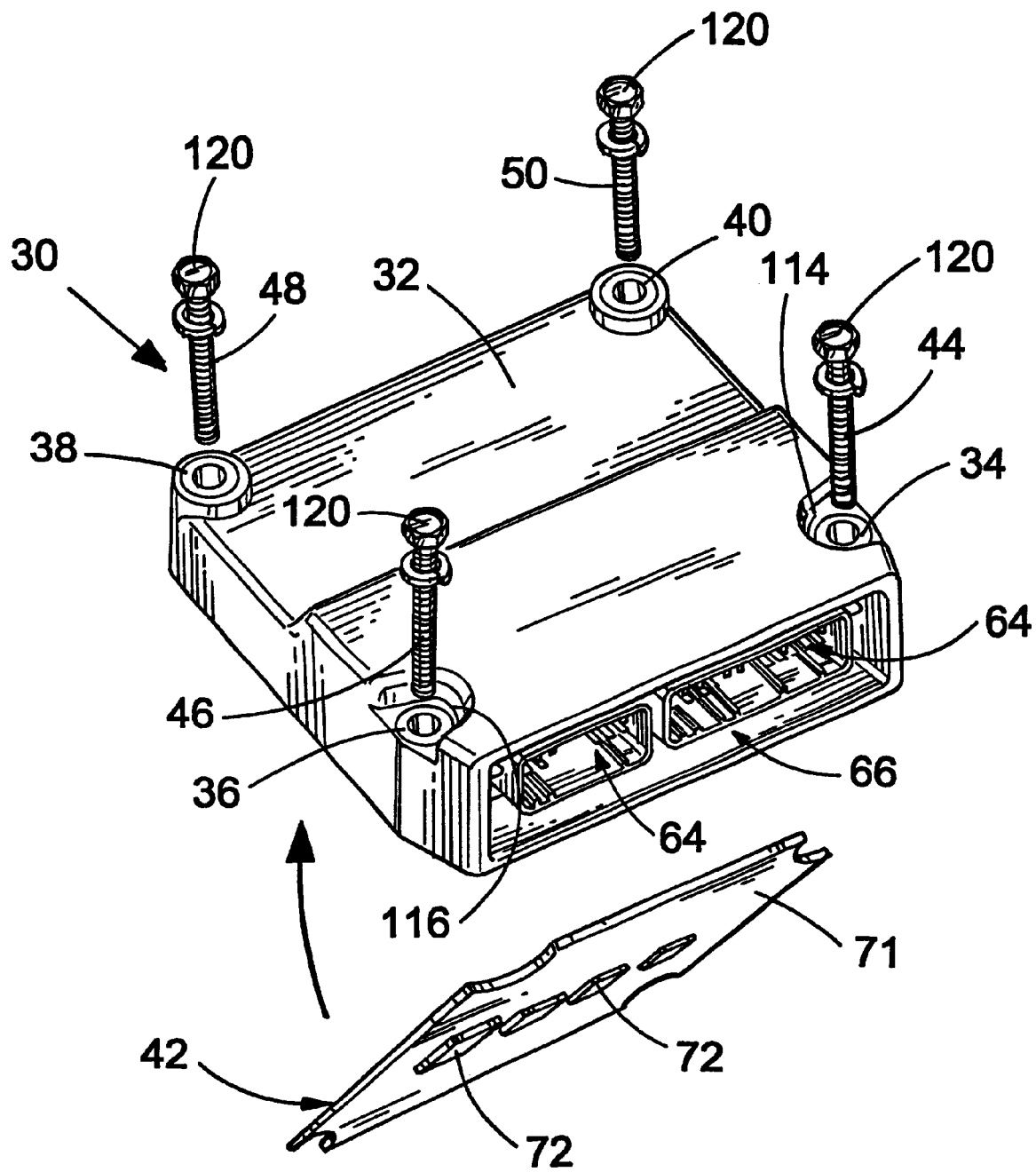
FIG. 2 is an exploded view of the enclosure, the bolts, and an electrical component.
Figure 3:
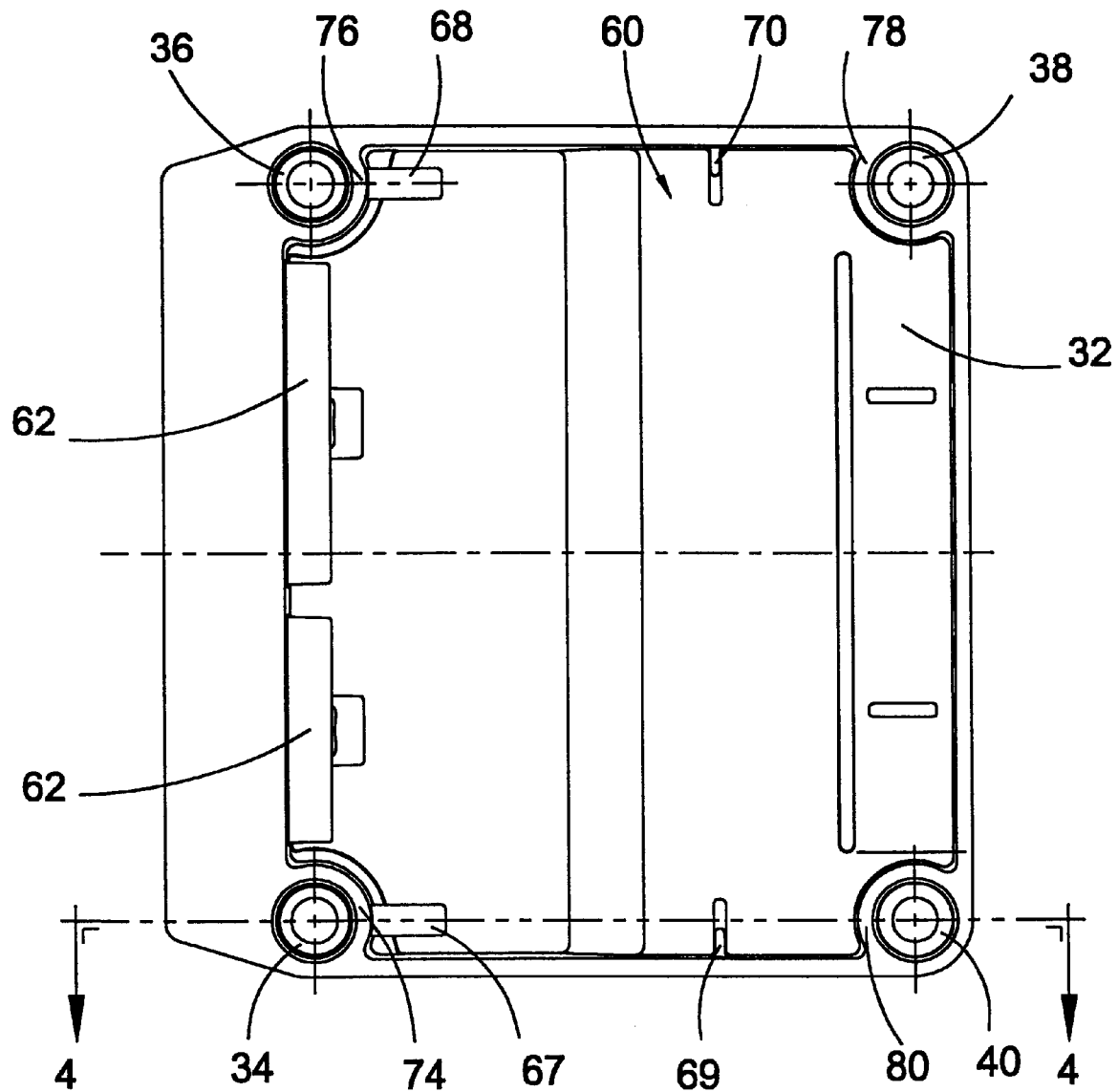
FIG. 3 is a plan bottom view of the enclosure.

Referring to FIG. 5, to receive and store the electrical component 42, the housing 32 includes a cavity 60. Referring to FIG. 2, to allow the electrical component 42 to be electrically connected to an external power source, the housing includes a pair of ports 62 that both include an array of terminals 64. The ports 62 provide access to the terminals 64. The terminals 64 are accessible through an aperture 66 of the housing 32, and, as shown in FIG. 3, the ports 62 are accessible from within the cavity 60. Referring to FIG. 3, a pair of fins 67, 68 and a pair of ribs 69, 70 can support the electrical component 42. The fins 67, 68 are similar to each other. The ribs 69, 70 are similar to each other. Referring to FIG. 3, the housing 32 can be made of any suitable metal, such as aluminum, or any suitable plastic as further described below, such as, a combination polycarbonate and polyester, polyamide, or acetal.

Referring to FIGS. 2 and 5, the electrical component 42 can include a printed circuit board 71 and a plurality of circuit elements 72, 72. The electrical component 42 can be configured such that it acts as a control module, such as an anti-lock brake module, an engine control module, a transmission control module, or an implement control module, with a backhoe attachment being an example of an implement. Referring to FIGS. 2 and 5, the printed circuit board 71 can be attached to the terminals 64 of the ports 62, 62 within the cavity 60.

Electrical connectors, such as, the connector described in U.S. Pat. No. 5,871,373 to Pacini et al., for example, can be connected to the terminals 64 of the ports 62, 62 through the aperture 66. The electrical connectors include wire assemblies which are a part of a wiring harness for the vehicle. The wiring harness can be connected to other components, such as, sensors, controls, and a battery, for example. The connection of the printed circuit board 71 to the ports 62, 62 thereby electrically connects the electrical component 42 through the terminals 64 to the electrical connectors and, thus, to the other components.

Referring to FIG. 3, the housing 32 includes generally cylindrical portions 74, 76, 78, 80. The portions 74, 76, 78, 80 are integral parts of the housing 32. The portions 74, 76, 78, 80 act as sleeves and contactingly engage the bushings 34, 36, 38, 40, respectively.

Referring to FIG. 1, the bushings 34, 36, 38, 40 provide the structure by which connection of the enclosure 30 to the frame 52 can be accomplished. The bushings 34, 36, 38, 40 are similar to each other. Accordingly, the description of one bushing can be applicable to any and all of the bushings 34, 36, 38, 40. Referring to FIGS. 7–10, the illustrative bushing 34 has a generally cylindrical, hollow body 88. It will be understood that the shape of the body 88 can be varied, for example a rectangular tube.

Figure 10:
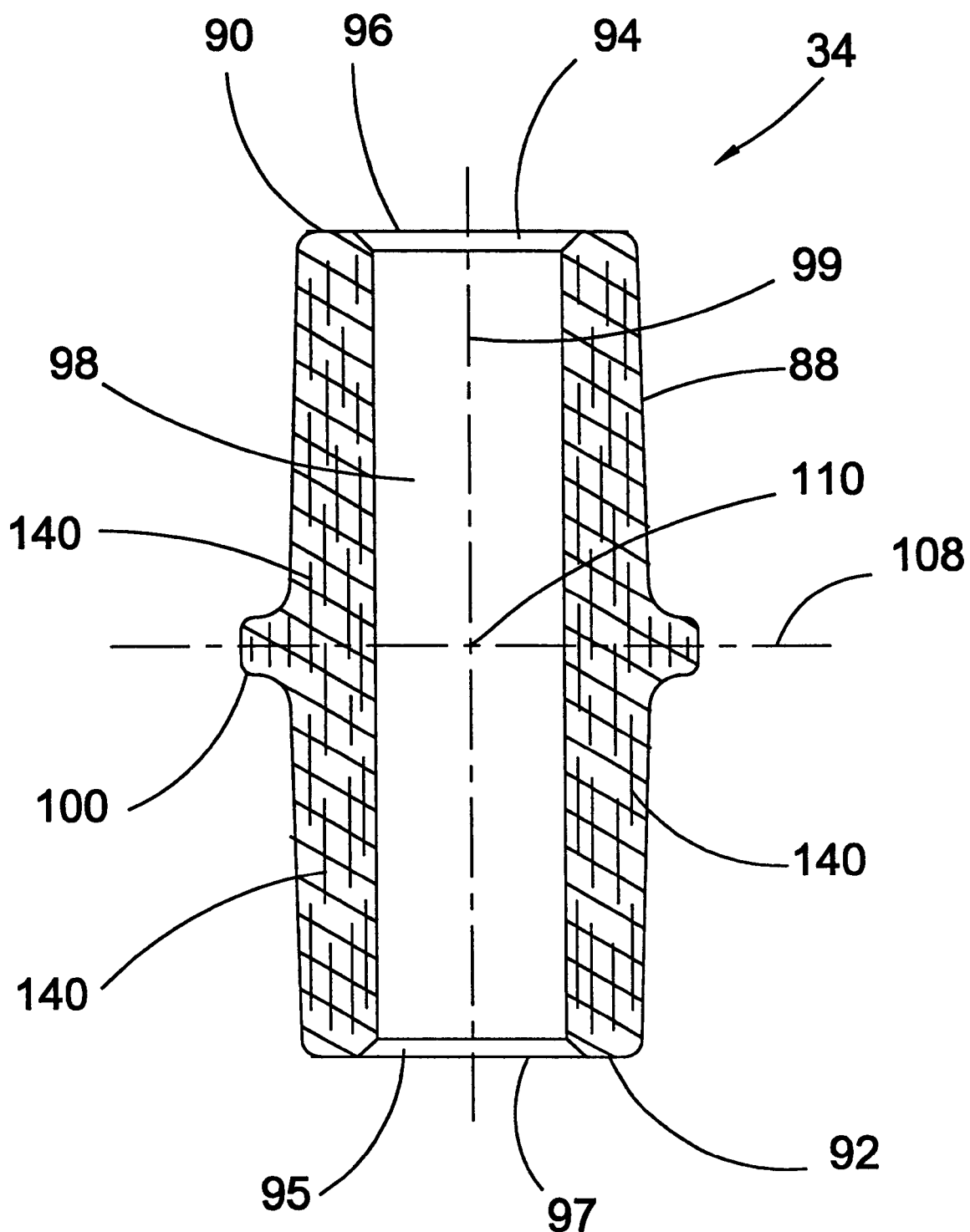
FIG. 10 is a cross-sectional view taken along line 10—10 in FIG. 9.

Referring to FIG. 10, the bushing 34 includes a first and a second end 90, 92. The ends 90, 92 respectively include first and second countersinks 94, 95 and first and second apertures 96, 97. The countersinks 94, 95 are located circumjacent to the apertures 96, 97, respectively. A bore 98 runs between the apertures 96, 97 and parallel to a longitudinal axis 99 of the bushing 34. The first counter sink 94 is disposed between the first aperture 96 and the bore 98. The second counter sink 95 is disposed between the second aperture 97 and the bore 98.

Figure 6:
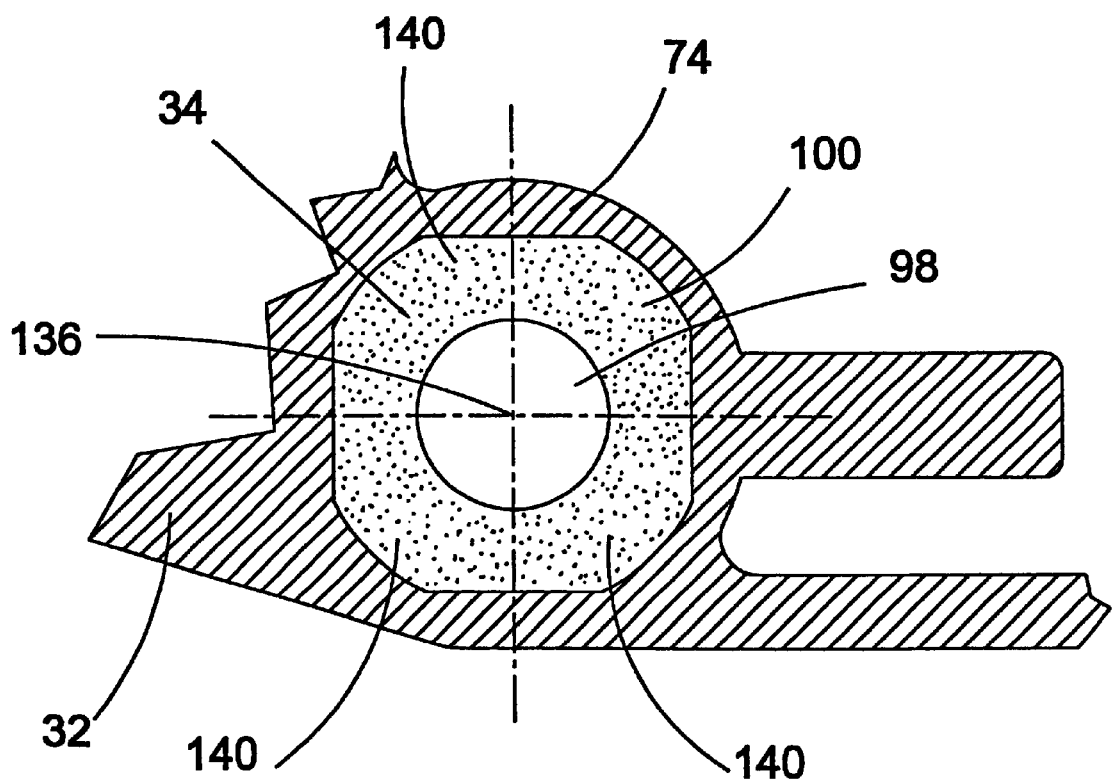
FIG. 6 is a cross-sectional view taken along line 6—6 in FIG. 4 that shows a flange of a plastic bushing.
Figure 7:
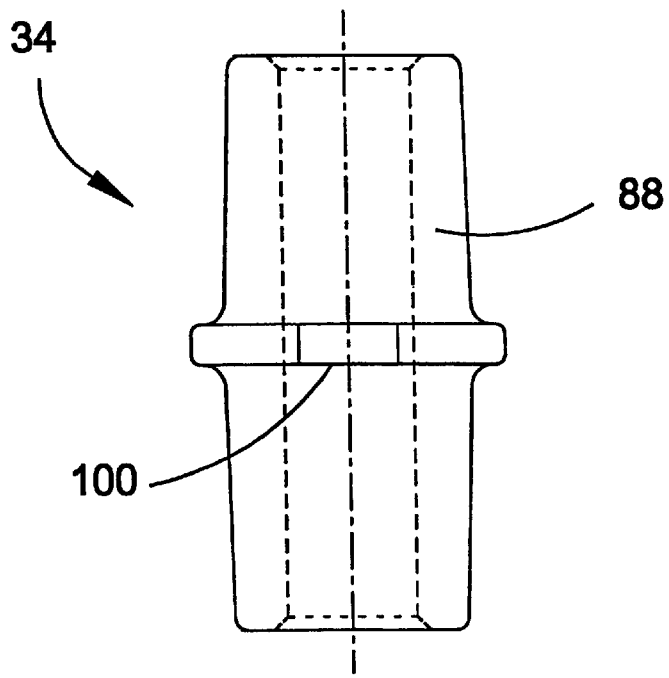
FIG. 7 is an elevational front view of the bushing.
Figure 8:
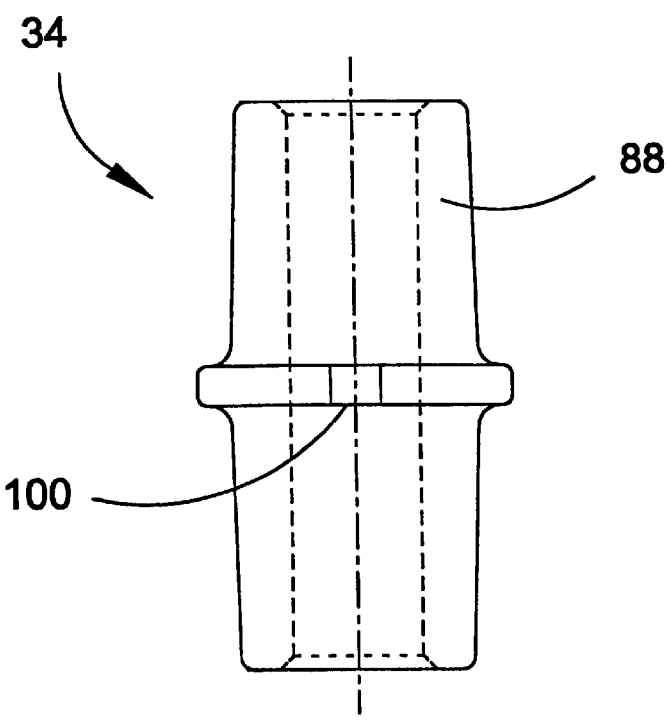
FIG. 8 is an elevational side view of the bushing.
Figure 9:
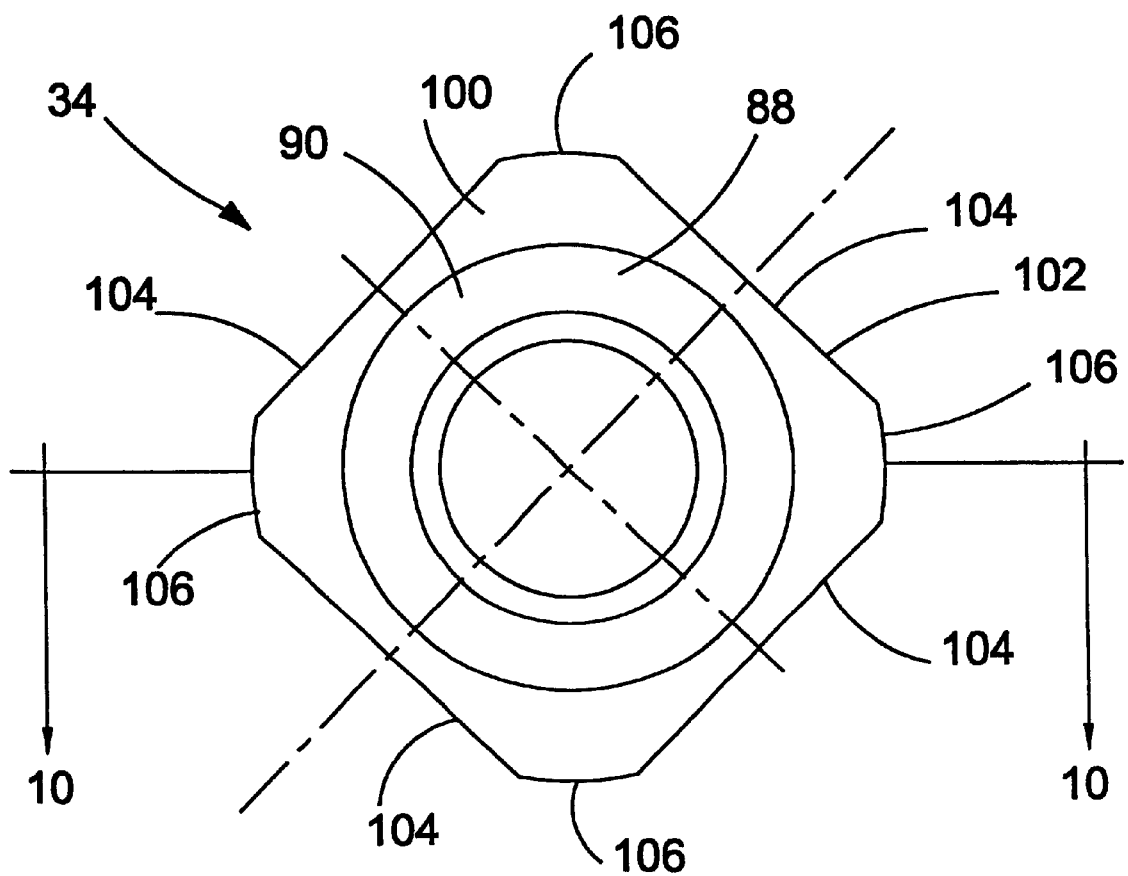
FIG. 9 is a plan end view of the bushing.

As shown in FIGS. 7–10, the bushing 34 includes a poly-sided flange 100 with a generally square perimeter 102 as shown in FIG. 9. More specifically, the perimeter 102 includes four faces 104 and four rounded corner portions 106. When viewed from the first end 90 of the bushing 34 as in FIG. 9, the corner portions 106 are rounded, and the faces 104 are planar. Referring to FIG. 6 the flange 100 of the bushing 34 contactingly engages the portion 74.

Referring to FIG. 10, the flange 100 is located substantially along a transverse axis 108 at a longitudinal midpoint to 110 of the bushing 34. The transverse axis 108 is perpendicular to the longitudinal axis 99. The location of the flange 100 provides the bushing 34 with symmetry about the transverse axis 108.

The bushings 34, 36, 38, 40 can be made of any suitable plastic as further described below, such as, polyamide, polyester, styrene, or acetal. The bushings 34, 36, 38, 40 in FIGS. 1–10 are preferably made of a polyamide derivative (also known as a copolymer).

Figure 4:
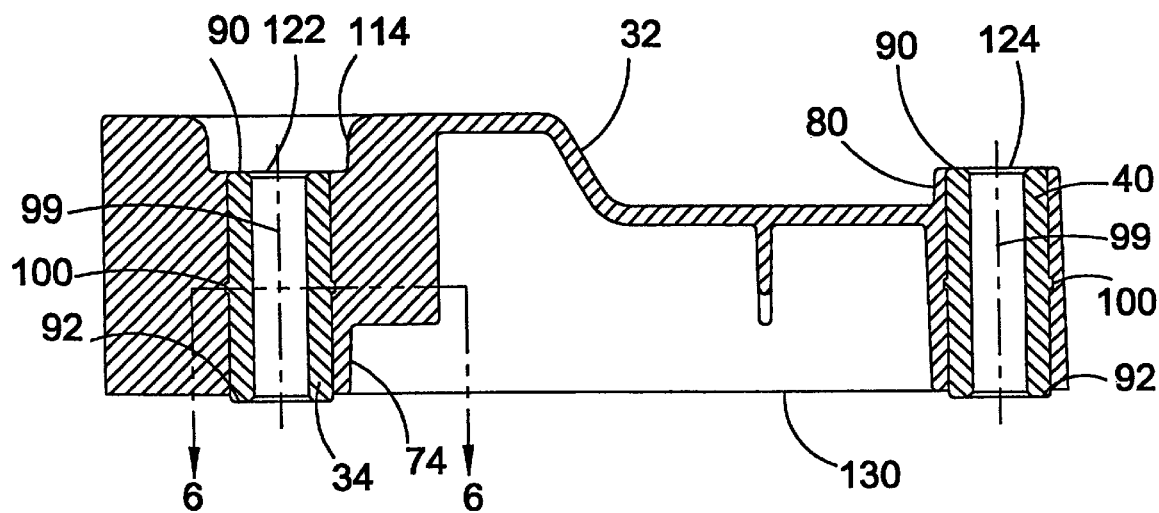
FIG. 4 is a cross-sectional view taken along line 4—4 in FIG. 3.

Referring to FIGS. 4 and 5, the plastic used for the bushings 34, 36, 38, 40 can have a thermal coefficient that is equal, or substantially equivalent, to a thermal coefficient of the material used for the housing 32. This feature allows both the housing 32 and the bushings 34, 36, 38, 40 to expand and contract equally when exposed to temperature changes, thereby maintaining a mechanical seal between the portions 74, 76, 78, 80 and the bushings 34, 36, 38, 40. The thermal coefficients of the bushings 34, 36, 38, 40 and of the housing 32 can be said to be equal, for example, by using the same material for the bushings and the housing. Alternatively, combinations of plastic, such as polyphenyloxide (PPO) and polyethylene terephthalate (PET), polybutylene terephthalate (PBT) and polycarbonate, or polyphthalamide (PPA) and poly (cyclohexylenedimethylene) terephthalate (PCT), for example, can be used, one in either part, to achieve substantially equivalent thermal coefficients in the bushings 34, 36, 38, 40 and the housing 32.

Referring to FIG. 2, the housing 32 includes a pair of recesses 114, 116. The bolts 44, 46, 48, 50 each include a head 120. Referring to FIGS. 4 and 5, the ends 90 of both of the bushings 34, 36 align with an end surface 122 of the recesses 114, 116, respectively. Referring to FIG. 1, the heads 120 of both of the bolts 44, 46 are held within the recesses 114, 116, respectively. Referring to FIGS. 4 and 5, the ends 90 of the bushings 40, 38 align with an end surface 124 of both of the portions 80, 78, respectively.

Referring to FIGS. 1 and 5, the plastic bushings 34, 36, 38, 40 provide the mechanical connection between the enclosure 30 and the frame 52. Referring to FIG. 1, the bolts 44, 46, 48, 50 are made of metal, typically steel, and pass through the bushings 34, 36, 38, 40, respectively, to secure the enclosure 30 to the frame 52. The bolts 44, 46, 48, 50 are examples of a fastener, which can include any kind of threaded fastener or non-threaded fastener known in the art. The bolts 44; 46, 48, 50 are similar to each other.

Referring to FIG. 5, the bolt 46 includes a threaded portion 126. The bolt 46 can be inserted into the first aperture 96 at the first end 90, through the bore 98, and out the second aperture 97 at the second end 92 of the bushing 36. The first countersink 94 facilitates insertion of the bolt 46 at the first end 90. The threaded portion 126 is used to attach the bolt 46 to the frame 52. The head 120 of the bolt 46 retains the enclosure 30. The head 120 is sized such that the it is seated within the first end 90. A washer 128 is disposed between the head 120 of the bolt 46 and the first end 90.

The interaction of the plastic bushings 36, 38 and the metal bolts 46, 48 does not cause an electrolytic reaction.

The plastic bushings 36, 38 are electrolytic-dissolution resistant and corrosion resistant, thereby eliminating the plating step required to overcome corrosive and electrolytic tendencies. These features result in a plastic bushing, such as the bushing 36, that is less costly to produce.

Referring to FIGS. 4 and 5, the second end 92 of each bushing 34, 36, 38, 40 protrudes from a mating surface 130. Referring to FIG. 5, the housing 32 is attached to the frame 52 such that the mating surface 130 is adjacent to the frame 52. By protruding from the mating surface 130, the bushings 34, 36, 38, 40 contact the frame 52. When attached to the frame 52, the housing 32 is separated from the frame 52 by an amount 131 as shown in FIG. 5 determined by the distance the bushings 34, 36, 38, 40 protrude from the mating surface 130. By acting as standoffs for the housing 32, the bushings 34, 36, 38, 40 reduce the amount of vibration the housing 32 and the attached electrical component 42 encounters.

Referring to FIG. 5, a bead 132 of room-temperature vulcanized material, such as epoxy, can be applied between the mating surface 130 and the frame 52 to provide a watertight seal between the housing 32 and the frame 52. The cavity 60 can be filled with a potting compound 134 to increase the dielectric withstand voltage between electrical component 42 and to protect the electrical component 42 from environmental conditions, such as water.

The illustrative plastic bushings 36, 38 resist creep, which is the permanent deformation over time of the plastic subjected to stress and/or temperature changes. In a bushing under rotational force, creep results in dimensional changes, causing the enclosure to loosen over time. The plastic bushings 36, 38 can withstand the torque exerted by, for example, the bolts 46, 48 attached by a fastening device, such as a torque driver. Referring to FIG. 5, the flange 100 provides resistance against translational and rotational movement in the housing 32 when a torque is applied to the bolt 46 and thus transmitted to the bushing 36. The plastic bushings 34, 36, 38, 40 are made from a plastic such that the plastic bushings can withstand a torque of 120 in·lbs., for example.

The flange 100 of each bushing prevents the bushings 34 (FIG. 4), 36 (FIG. 5), 38 (FIG. 5), 40 (FIG. 4) from translating relative to the housing 32 along the longitudinal axis 99 of the bushings. The portions 74 (FIG. 4), 76 (FIG. 5), 78 (FIG. 5), 80 (FIG. 4) prevent the bushings 34, 36, 38, 40, respectively, from translating relative to the housing 32 along the transverse axis of the bushings. Referring to FIG. 6, the flange 100 prevents the bushing 34 from rotating relative to the housing 32.

Referring to FIG. 10, the bushing 34 includes a plurality of fibers 140 as a filler. The fibers 140 provide strength along the longitudinal axis of the fibers 140 to resist torque stress. The illustrative fibers have a length to diameter ratio of 8:1. The length to diameter ratio can be varied. The alignment of the fibers 140 in the direction of the stress helps improve the effectiveness of the fibers 140. The fibers 140 in the bushing 34 are optimally aligned parallel to the longitudinal axis 99 as shown in FIGS. 6 and 10 for maximum resistance to torque stress from the bolt 44. To facilitate manufacturing the bushing, the fibers are preferably oriented about ±10 degrees to the longitudinal axis 99. However, the fibers 140 can be oriented about ±45 degrees to the longitudinal axis 99 and be operative. The fibers 140 can be made of glass, graphite, or aluminum, for example.

The plastic used in the plastic bushing 34 is also temperature resistant. Temperature-resistant plastic can withstand temperature extremes between −40° C. and +125° C., for example. The glass fibers 140 lose strength above a certain temperature, called the glass transition temperature. The glass transition temperature is preferably +125° C. or greater.

The plastic bushing of the present invention can be made by, for example, injection molding, compression molding, or extruded molding. Referring to FIG. 10, the plastic bushing 34 is preferably made by injection molding. The fibers 140 can be added to the plastic used to make the bushing 34 when the plastic bushing is produced. To make the bushing 34, the molten plastic containing the fibers 140 is injected into the bushing mold. The fibers 140 tend to become aligned in the direction of the flow of the molten plastic. By gating the nozzle flow of the molten plastic into the bushing mold, the fibers 140 can be aligned within the bushing 34. Upon cooling, the fibers 140 are embedded in the plastic bushing 34.

The plastic bushing 34 is less expensive to produce than a metal bushing. The raw material cost of a suitable plastic for the bushing 34 is less expensive than the cost of the metal used in the prior art. Further, the manufacturing cost of the plastic bushing 34 is less than those costs of the metal bushing. Plastic molding is less expensive than metal forming. The metal bushing must be fabricated using metal-forming processes, such as screw-machining or stamping. Both processes result in low part-per-minute fabrication. The plastic bushing 34 can be molded using multi-cavity tooling, increasing the part-per-minute output over the prior art. Metal-forming processes require more maintenance than molding processes. The metal bushing requires a secondary deburring step not needed when using plastic molding processes.

The housing 32 can be made by, for example, insert molding, injection molding, machined plastic, or compression molding. Referring to FIG. 3, the housing 32 is made by being insert molded around the bushings 34, 36; 38, 40. "Insert molding" describes, from the point of view of a first part, a process to form the first part including: inserting a previously-manufactured second part into a mold in which the first part is to be molded and delivering a predetermined amount of mold material to the mold. "Over molding" describes, from the point of view of the second part, the same process. In this case, the housing is the first part and is insert molded, and the plastic bushings are the second parts and are over molded. By being over molded to form the housing 32, the bushings 34, 36, 38, 40 are embedded in the housing 32 such that the housing 32 and the bushings 34, 36, 38, 40 are contactingly engaged.

A metal bushing is either inserted into the housing during a secondary, press-in step or over molded with the plastic housing during a mold cycle with an increased time. Although a metal bushing can be over molded, the heat transfer differences between metal and plastic can cause the housing to warp. To avoid warpage, the insert-molded plastic housing and the over-molded metal bushing are held in the mold until the prior art enclosure cools adequately. This cooling time increases the mold cycle time, thus increasing the manufacture cost.

The plastic bushing 36 is compatible with over molding techniques used in the production of the plastic housing 32 and, therefore, does not require a secondary, press-in step. Further, the plastic bushing 36 can be over molded during the production of the housing 32 within acceptable tolerances for warpage. The over-molding process for the bushing 36 can use a standard mold cycle time, i.e., a mold cycle without an increased hold period for cooling, thereby reducing the mold cycle time required to allow the enclosure to cool while fixed in the mold.

Referring to FIG. 10, the symmetry of the flange 100 can increase the ease of manufacture of the enclosure 30. The symmetry of the flange 100 about the transverse axis 108 at the longitudinal midpoint 110 of the bushing 34 allows the bushing 34 to be indexed about either the first end 90 or the second end 92. More specifically, as shown in FIG. 4 the bushing 34 can be over molded to form the housing 32 in either orientation, that is, with either the first end 90 or the second end 92 adjacent the mating surface 130. Referring to FIG. 5, the presence of the first and second countersinks 94, 95 at the ends 90, 92, respectively, facilitates the insertion of the bolt 46 into the bore 98 in either orientation of the bushing 36.

Figure 11:
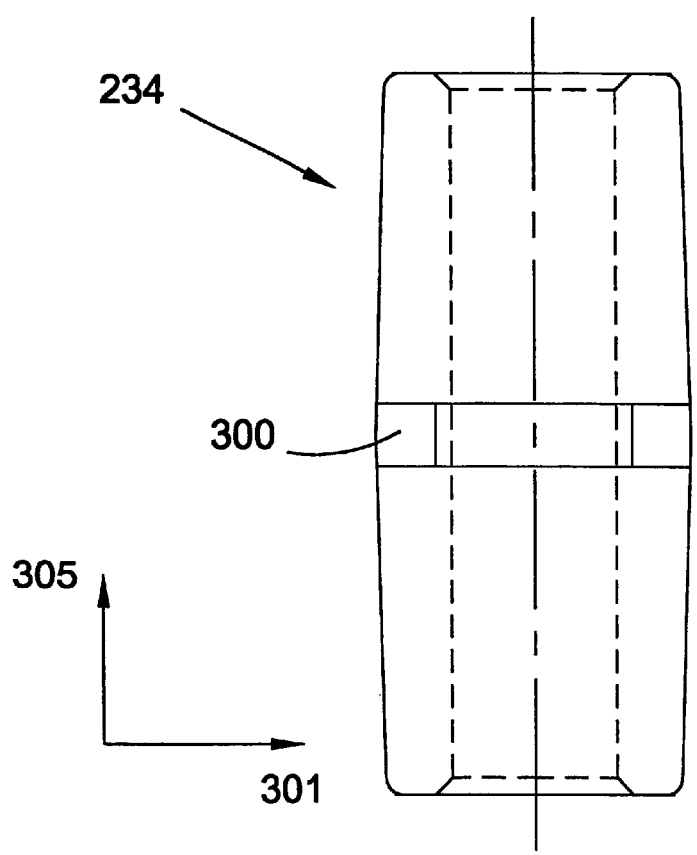
FIG. 11 is an elevational side view of another embodiment of a bushing.
Figure 12:
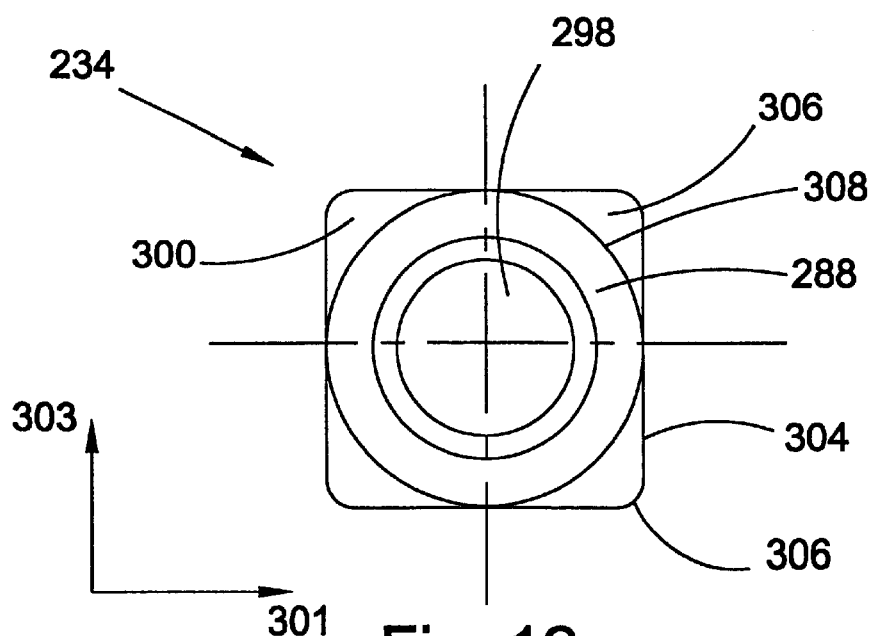
FIG. 12 is a plan end view of the bushing of FIG. 11.

It will be understood that the size of the flange can be varied. FIGS. 11 and 12 depict another embodiment of a bushing 234 with a flange 300. FIG. 11 shows a horizontal X axis 301 and a vertical, longitudinal Z axis 305. The X axis 301 and the Z axis 305 are perpendicular to each other. FIG. 12 shows the X axis 301 and a transverse Y axis 303. The Y axis 303 and the X axis 301 are perpendicular to each other. The Y axis 303 and the Z axis 305 are perpendicular to each other.

Referring to FIG. 11, the thickness of the flange 300 and the height of the bushing 234 are measured along the Z axis 305. The height of the bushing 234 can be varied. The thickness of the flange 300 can be varied.

Referring to FIG. 12, a face 304 of the flange 300 is aligned with an outer diameter 308 of a body 288 of the bushing 234. The face 304 lies on an axis tangential to the outer diameter 308 of the body 288. The size and shape of the flange 300, the body 288, and a bore 298 can be varied in relation to the X axis 301 and/or the Y axis 303. The body 288 and the bore 298 are both cylindrical with a circular cross section. The bore 298 is concentric with the body 288 but need not be. The cross section of the body 288 and/or the bore 298 can be varied to be, for example, a rectangular cross section. The size of the flange 300 can be varied about the X axis 301 and/or the Y axis 303 to be as large as the housing can accommodate and as small as the cross section of the bore 298. The flange can be irregularly shaped and need not have the same dimension along the X axis 301 as the Y axis 303. For example, a rounded corner portion 306 can be extended to a predetermined location defined by the X axis 301 and/or the Y axis 303.

Figure 13:
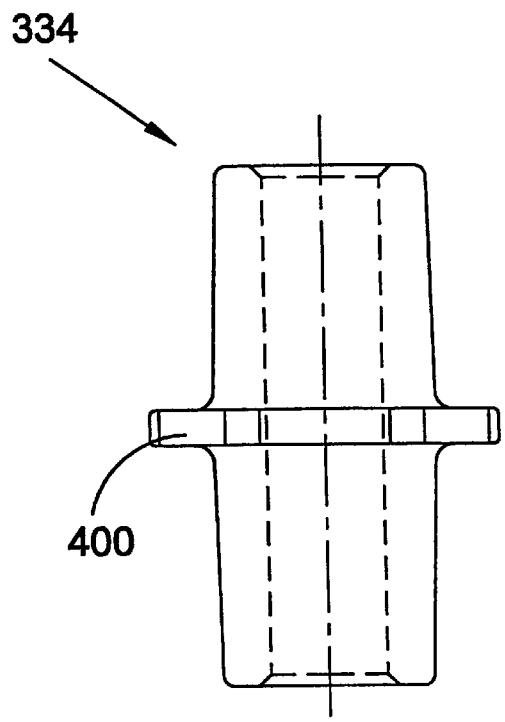
FIG. 13 is an elevational side view of another embodiment of a bushing with a pentagonal flange.
Figure 14:
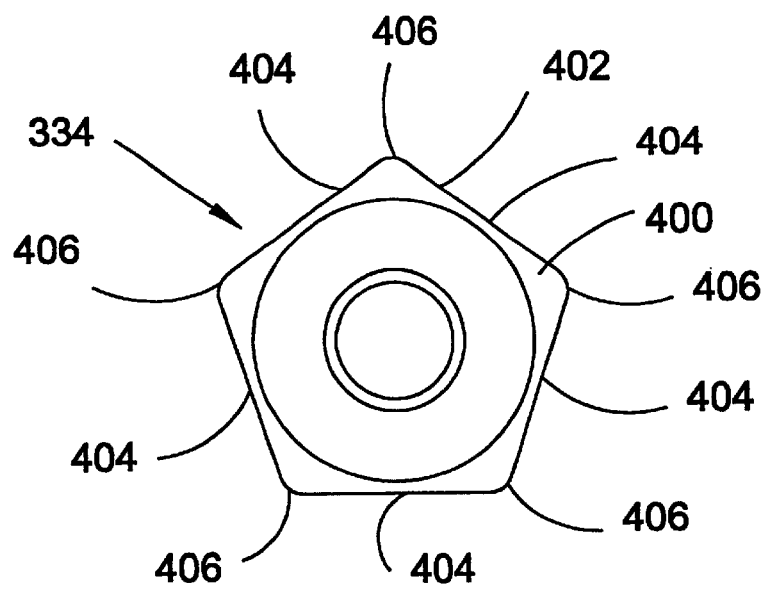
FIG. 14 is a plan end view of the bushing of FIG. 13.
Figure 15:
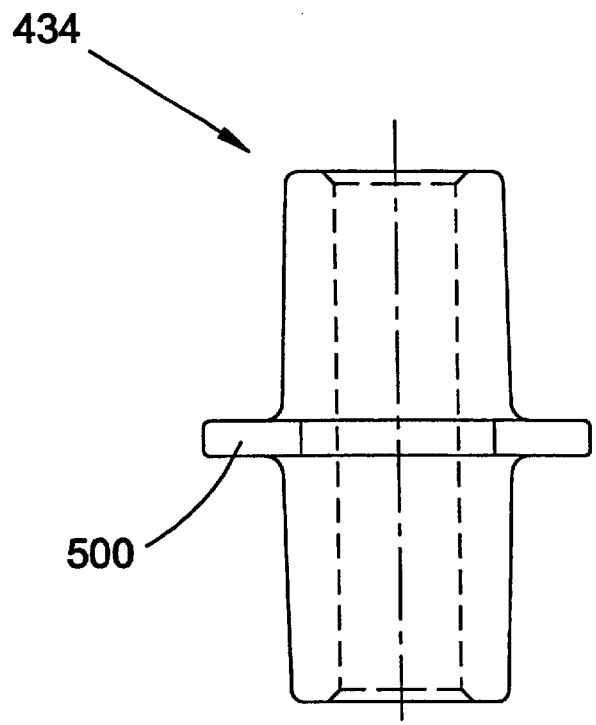
FIG. 15 is an elevational side view of another embodiment of a bushing with a hexagonal flange.
Figure 16:
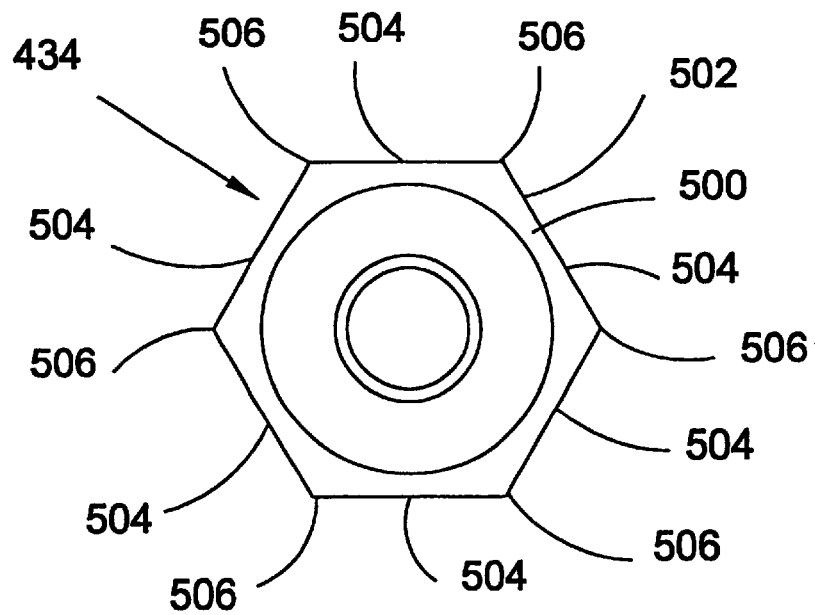
FIG. 16 is a plan end view of the bushing of FIG. 15.

It will be understood that the shape of the flange can be varied. For example, FIGS. 13 and 14 depict another embodiment of a bushing 334 with a flange 400 with a generally pentagonal perimeter 402 as shown in FIG. 14. More specifically, the perimeter 402 includes five faces 404 and five rounded corner portions 406. As another example, FIGS. 15 and 16 depict another embodiment of a bushing 434 with a flange 500 with a generally hexagonal perimeter 502 as shown in FIG. 16. More specifically, the perimeter 502 includes six faces 504 and six corner portions 506.

Figure 17:
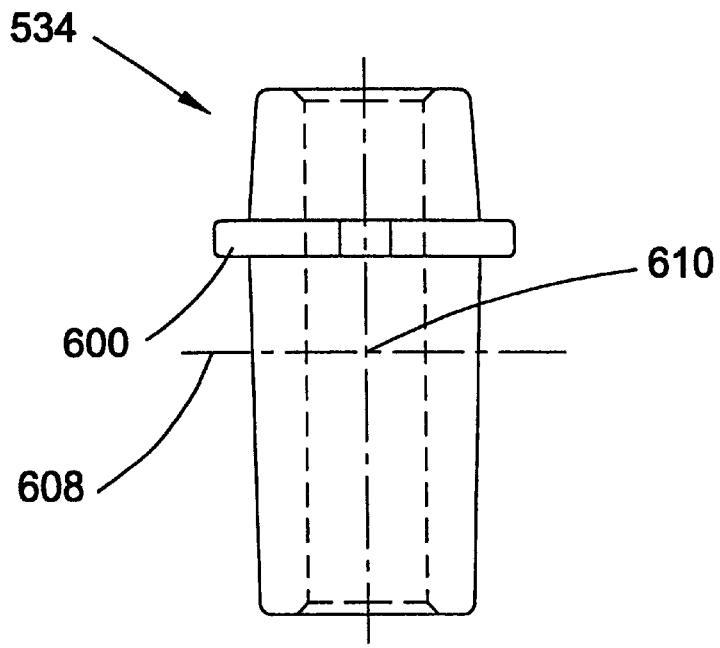
FIG. 17 is an elevational side view of another embodiment of a bushing with an offset flange.

FIG. 17 depicts another embodiment of a bushing 534 with an offset flange 600. The flange 600 is disposed a predetermined amount from a transverse axis 608 at a longitudinal midpoint 610 to provide the bushing 534 with a polarity.

Figure 18:
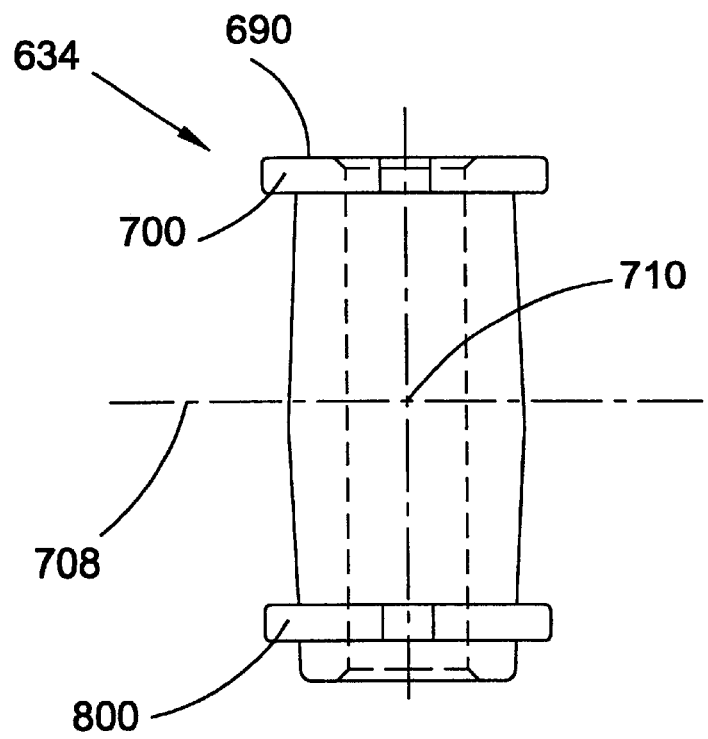
FIG. 18 is an elevational side view of another embodiment of a bushing with a plurality of flanges.

FIG. 18 depicts another embodiment of a bushing 634 with a first flange 700 and a second flange 800. The flanges 700, 800 further increase the mechanical connection between the bushing 634 and the housing 32. The flange 700 is located such that it is flush with a first end 690 of the bushing 634. The flanges 700, 800 can be symmetrically arranged on the bushing 634 about a transverse axis 708 at a longitudinal midpoint 710 of the bushing 634.

From the foregoing it will be understood that modifications and variations can be effectuated to the disclosed structures—particularly in light of the foregoing teachings—without departing from the scope or spirit of the present invention. As such, no limitation with respect to the specific embodiments described and illustrated herein is intended or should be inferred. In addition, all references and copending applications cited herein are hereby incorporated by reference in their entireties.

What is claimed is:

1. An enclosure comprising:
   a housing with a cavity, the housing having a wall, the housing having a port, the port located on the wall, and a terminal held by the port such that a first end of the terminal protrudes from a first side of the wall into the cavity and a second end protrudes from a second side of the wall, the terminal being attached at the first end of an electrical component, the cavity being sized such that it contains the electrical component, and
   a plastic bushing, the plastic bushing having a pair of ends, an aperture at both ends, and a bore passing between the apertures through the plastic bushing, and the plastic bushing being connected to the housing such that a fastening device can extend through the bore to attach the enclosure to a frame.

2. The enclosure described in claim 1 wherein the housing is made from plastic.

3. The enclosure as described in claim 2 wherein the plastic bushing is constructed such that it is compatible with an over-molding process.

4. The enclosure as described in claim 3 the housing further comprising a mating surface, wherein either end of the plastic bushing can be located adjacent to the mating surface.

5. The enclosure as described in claim 4, the plastic bushing further comprising a countersink located circumjacent to both apertures.

6. The enclosure described in claim 1 wherein the housing is made from metal.

7. The enclosure as described in claim 1 wherein the frame is a part of a vehicle.

8. The enclosure as described in claim 1, the plastic bushing further comprising a flange.

9. The enclosure as described in claim 8 wherein the flange is poly-sided.

10. The enclosure as described in claim 9 wherein the flange has a generally square perimeter.

11. The enclosure as described in claim 9 wherein the flange has a generally pentagonal perimeter.

12. The enclosure as described in claim 9 wherein the flange has a generally hexagonal perimeter.

13. The enclosure as described in claim 8, the flange further comprising a plurality of faces.

14. The enclosure as described in claim 8, the flange further comprising a plurality of corner portions.

15. The enclosure as described in claim 14 wherein the corner portions are round.

16. The enclosure as described in claim 8 wherein the flange translationally retains the bushing within the housing.

17. The enclosure as described in claim 16 wherein the flange rotationally retains the bushing within the housing.

18. The enclosure as described in claim 8 wherein the flange rotationally retains the bushing within the housing.

19. The enclosure as described in claim 1, the plastic bushing further comprising a plurality of fibers embedded in the plastic bushing.

20. The enclosure as described in claim 19 wherein the fibers are made of glass.

21. The enclosure as described in claim 19 wherein the fibers are made of aluminum.

22. The enclosure as described in claim 19 the bore having a longitudinal axis, and wherein the fibers are oriented about ±10 degrees to the longitudinal axis of the bore.

23. The enclosure as described in claim 19 wherein the fibers are aligned with each other.

24. The enclosure as described in claim 23, the bore having a longitudinal axis, and wherein the fibers are oriented parallel to the longitudinal axis of the bore.

25. The enclosure as described in claim 19 wherein the plastic bushing is made from a temperature-resistant plastic.

26. The enclosure as described in claim 1 wherein the plastic bushing is made from a temperature-resistant plastic.

27. The enclosure as described in claim 1 wherein the plastic bushing has a first thermal coefficient and the housing has a second thermal coefficient, the first and second thermal coefficients being equal to each other.

28. The enclosure as described in claim 1 wherein the plastic bushing has a first thermal coefficient and the housing has a second thermal coefficient, the first and second thermal coefficients being substantially equivalent to each other.

29. The enclosure as described in claim 1 wherein the plastic bushing is made from a plastic such that the plastic bushing is electrolytic-dissolution resistant.

30. The enclosure as described in claim 29 wherein the plastic bushing is made from a plastic such that the plastic bushing is corrosion resistant.

31. The enclosure as described in claim 1 wherein the plastic bushing is made from a plastic such that the plastic bushing is corrosion resistant.

32. The enclosure as described in claim 1 the housing further comprising a mating surface, wherein one of the ends of the plastic bushing protrudes from the mating surface of the housing.

33. The enclosure as described in claim 32 wherein a bead of room-temperature vulcanized material is applied between the mating surface and the frame to provide a water-tight seal between the housing and the frame.

34. The enclosure as described in claim 32 wherein the cavity is filled with a potting compound.

35. The enclosure as described in claim 33 wherein the cavity is filled with a potting compound.

36. The enclosure as described in claim 1 wherein the cavity is filled with a potting compound.

37. The enclosure as described in claim 1 wherein the plastic bushing is made from a plastic such that the plastic bushing can withstand a torque of 120 in·lbs.

38. The enclosure as described in claim 1 the plastic bushing further comprising a countersink located circumjacent to both apertures.

39. The enclosure as described in claim 1 wherein the electrical component is an anti-lock braking module.

40. The enclosure as described in claim 1 wherein the electrical component is an engine control module.

41. The enclosure as described in claim 1 wherein the electrical component is a transmission control module.

42. The enclosure as described in claim 1 wherein the electrical component is an implement control module.

* * * * *

UNITED STATES PATENT AND TRADEMARK OFFICE
CERTIFICATE OF CORRECTION

| | | |
|---|---|---|
| PATENT NO. | : 6,420,652 B1 | Page 1 of 1 |
| APPLICATION NO. | : 09/576395 | |
| DATED | : July 16, 2002 | |
| INVENTOR(S) | : Byczek | |

It is certified that error appears in the above-identified patent and that said Letters Patent is hereby corrected as shown below:

Column 4, Line 55: "44;" should read --44,--.

Column 6, Line 26: "screw-machining" should read --screw machining--.

Signed and Sealed this

Fifteenth Day of January, 2008

JON W. DUDAS
*Director of the United States Patent and Trademark Office*